(12) United States Patent
Mazda

(10) Patent No.: US 6,781,458 B2
(45) Date of Patent: Aug. 24, 2004

(54) PROVIDING DC ISOLATION IN SWITCHING AMPLIFIERS

(75) Inventor: Babak Mazda, Mountain View, CA (US)

(73) Assignee: Tripath Technology, Inc., San Jose, CA (US)

( * ) Notice: Subject to any disclaimer, the term of this patent is extended or adjusted under 35 U.S.C. 154(b) by 0 days.

(21) Appl. No.: 10/454,789

(22) Filed: Jun. 3, 2003

(65) Prior Publication Data

US 2004/0036533 A1 Feb. 26, 2004

Related U.S. Application Data

(60) Provisional application No. 60/405,751, filed on Aug. 23, 2002.

(51) Int. Cl.[7] ............................ H03F 3/217; H03F 1/52
(52) U.S. Cl. ...................................... 330/251; 330/298
(58) Field of Search ............................. 330/10, 207 A, 330/207 P, 251, 298; 327/309, 310, 319, 327

(56) References Cited

U.S. PATENT DOCUMENTS 4,992,751 A * 2/1991 Attwood et al. .............. 330/10

OTHER PUBLICATIONS

"High Voltage Pulsar Circuits", Supertex inc., VN/VP13 Series Application Note AN–D8, May 16, 2001, pp. 1–4.
"50W Class D Audio Amplifier Evaluation Board" Acoustar, Zetex, ZXCD50STEVAL, Issue 1, Jul. 2002, pp. 1–12.

* cited by examiner

*Primary Examiner*—Steven J. Mottola
(74) *Attorney, Agent, or Firm*—Beyer Weaver & Thomas, LLP

(57) ABSTRACT

A switching circuit is described which includes an output switch having a drive terminal and a power supply terminal. Driver circuitry provides a drive signal to the output switch. Isolation circuitry provides DC isolation between the driver circuitry and the output switch. Transient control circuitry controls the drive terminal, thereby keeping the output switch off during stabilization of a supply voltage at the power supply terminal.

22 Claims, 1 Drawing Sheet

PROVIDING DC ISOLATION IN SWITCHING AMPLIFIERS

RELATED APPLICATION DATA

The present application claims priority from U.S. Provisional Patent Application No. 60/405,751 for PROVIDING DC ISOLATION IN SWITCHING AMPLIFIERS filed on Aug. 23, 2002, the entire disclosure of which is incorporated herein by reference for all purposes.

BACKGROUND OF THE INVENTION

The present invention relates generally to providing DC isolation in a switching amplifier or switch mode power supply topology.

A variety of techniques may be employed in switching circuit topologies to provide isolation between relatively high power output devices and the relatively low power circuitry which drives them. Such techniques include capacitive and inductive coupling. One of the challenges associated with such techniques relates to the state of the output device during power up. That is, if the gates of the output devices are left floating while the power supplies are ramping up, the output devices may be conducting during this time. This is particularly undesirable in audio applications in that this often results in an unpleasant popping sound from the loudspeaker being driver by the switching amplifier. In some cases, this transient condition can even be catastrophic to the output devices and/or the load being driven.

It is therefore desirable to provide DC isolation techniques for use in switching circuit topologies which avoid this problem.

SUMMARY OF THE INVENTION

According to the present invention, techniques are provided by which the state(s) of output device(s) in a switching circuit is (are) controlled during power up to avoid the transient condition described above. More specifically, various embodiments of the present invention control the initialization of the gates of such output devices to prevent such transient conditions. According to a specific embodiment, a switching circuit is provided which includes an output switch having a drive terminal and a power supply terminal. Driver circuitry provides a drive signal to the output switch. Isolation circuitry provides DC isolation between the driver circuitry and the output switch. Transient control circuitry controls the drive terminal, thereby keeping the output switch off during stabilization of a supply voltage at the power supply terminal.

According to a more specific embodiment, a switching amplifier is provided which includes first and second output FETs in a half-bridge, single-ended configuration coupled between high side and low side power supply terminals. Driver circuitry provides complementary drive signals to the first and second output FETs. First and second capacitors couple the driver circuitry to the first and second output FETs, respectively, providing DC isolation therebetween. A first clamping transistor is coupled between the gate of the first output FET (e.g., a p-channel device) and the high side power supply terminal. A first RC network is coupled to the high side power supply terminal and is operable to drive the first clamping transistor. A second clamping transistor is coupled between the gate of the second output FET (e.g., an n-channel device) and the low side power supply terminal. A second RC network is coupled to the low side power supply terminal and is operable to drive the second clamping transistor. The clamping transistors and the RC networks are operable to clamp the gates of the output FETs to a high and low side supply voltages at the respective power supply terminals for a predetermined period of time, thereby keeping the output FETs off during stabilization of the high and low side supply voltages.

A further understanding of the nature and advantages of the present invention may be realized by reference to the remaining portions of the specification and the drawings.

DETAILED DESCRIPTION OF SPECIFIC EMBODIMENTS

Reference will now be made in detail to specific embodiments of the invention including the best modes contemplated by the inventor for carrying out the invention. Examples of these specific embodiments are illustrated in the accompanying drawings. While the invention is described in conjunction with these specific embodiments, it will be understood that it is not intended to limit the invention to the described embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In addition, well known features may not have been described in detail to avoid unnecessarily obscuring the invention.

Figure 1:
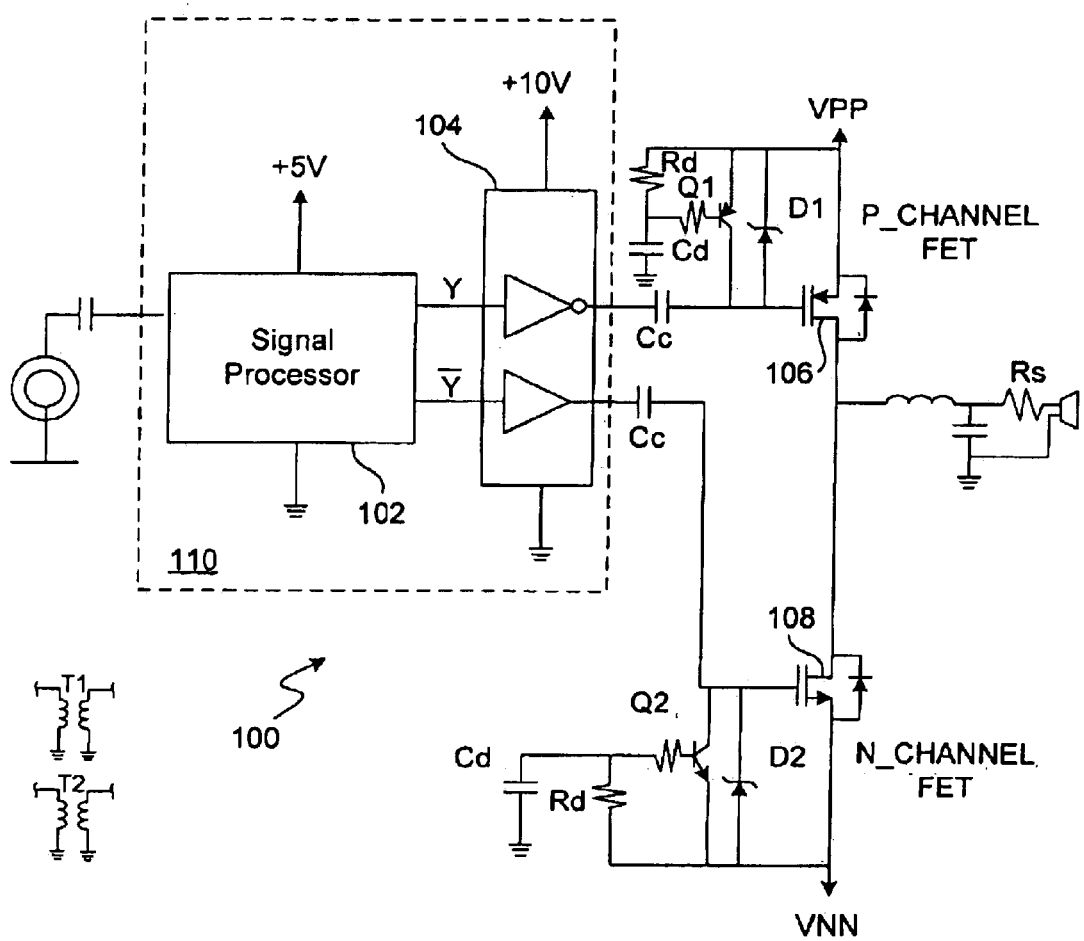
FIG. 1 is a simplified schematic of a switching circuit topology implemented according to a specific embodiment of the invention.

FIG. 1 illustrates a single audio channel switching amplifier in which a particular embodiment of the invention may be implemented. Switching amplifier 100 includes a low voltage, noise-shaping signal processor 102 which generates complementary 1-bit digital signals Y and $\overline{Y}$. According to the embodiment shown, these 0~5V signals are level shifted by high current driver circuit 104 to 0~10V signals to provide the appropriate voltage and current levels to drive output FETs 106 and 108. It will be understood that this level shifting is not required in all embodiments of the invention. That is, high current logic devices are available which are capable of providing sufficient drive to the output FETs with 0~5V signals. Two capacitors $C_C$ provide DC isolation between the output FETs and current driver circuit 104 and, along with diodes D1 and D2, level shift the output signals of circuit 104 to VPP~VPP−10 volts at the gate of high side FET 106, and VNN~VNN+10 volts at the gate of low side FET 108. According to embodiments in which the FET driving voltages are relatively low, e.g., the 10 volt range, diodes D1 and D2 may comprise signal diodes. According to other embodiments in which the FET driving voltage is higher, e.g., the 15 volt range, zener diodes may be used to clamp the gates to ±10 volts.

Transistors Q1 and Q2 squelch the gates of output FETs 106 and 108 (in accordance with the time constant corresponding to Rd and Cd) during the time when supply voltages VPP and VNN are ramping up. That is, because of the RC time constants, the base terminals of transistors Q1 and Q2 lag behind the supply voltages keeping transistors Q1 and Q2 turned on, effectively clamping the gates of the output FETs to the supply voltages, thereby ensuring that the output FETs remain off until the supply voltages have stabilized and transistors Q1 and Q2 subsequently turn off. This eliminates the annoying and potentially catastrophic turn-on pop at the speaker (i.e., when one of the devices is on), or the catastrophic shoot-through current (i.e., when both devices are on) which might otherwise occur as a result of the indeterminate state of the gates of the output FETs. Obviously the turn-on pop is specific to audio applications to which the invention is not limited. More generally stated, the present invention is advantageous in that the output switches of a switching amplifier or switch mode power supply are kept off during supply voltage ramp up. As will be understood, the values of Rd and Cd may be selected to create any desired delay time between supply stabilization and the turn off of Q1 and Q2.

According to a particular implementation, a significant benefit may be derived from the DC isolation provided by capacitors $C_C$. That is, because driver circuit 104 is isolated from the high supply voltages (e.g., ±50V) required by the output FETs, it does not have the breakdown voltage requirements of a driver circuit directly coupled to the output switches. Thus, if driver circuit 104 is implemented as an integrated circuit a lower voltage (and therefore less expensive) process may be employed in its fabrication.

In addition, the isolation of driver circuit 104 from the output FETs creates an opportunity to integrate driver circuit 104 with the low voltage circuitry of signal processor 102 in a single monolithic integrated circuit (represented by dashed line 110). Thus, for example, in the exemplary embodiment shown in FIG. 1, a 16~20V process with geometries around 0.5 uM could be used for such a monolithic IC instead of a 80~100V process (with the correspondingly larger geometries) for driver circuit 104, and a 5~10V process for processor 102. In general, lower voltage processes are less expensive and more common than their high voltage counterparts, allowing the designer to select from a greater variety of mature processes offered by a greater number of semiconductor fabs.

While the invention has been particularly shown and described with reference to specific embodiments thereof, it will be understood by those skilled in the art that changes in the form and details of the disclosed embodiments may be made without departing from the spirit or scope of the invention. For example, the present invention relates generally to enabling DC isolation in a switching amplifier topology by ensuring that the output switch(es) remain(s) off while the power suppl (ies) ramp(s) up. The techniques described herein may be applied to any of a wide variety of switching circuit topologies and should not be limited to the specific audio amplifier topology described. That is, the present invention may be employed with, for example, any type of digital or class D amplifier including sigma delta modulators, modified sigma delta modulators (e.g., Class T amplifiers available from Tripath Technology Inc. of Santa Clara, Calif.), any type of pulse width modulation (PWM) amplifier, etc. Even more generally, because the failure mode described above occurs in switch mode power supplies (SMPS), the techniques described herein may also be employed in such devices according to the present invention.

Figure 2:
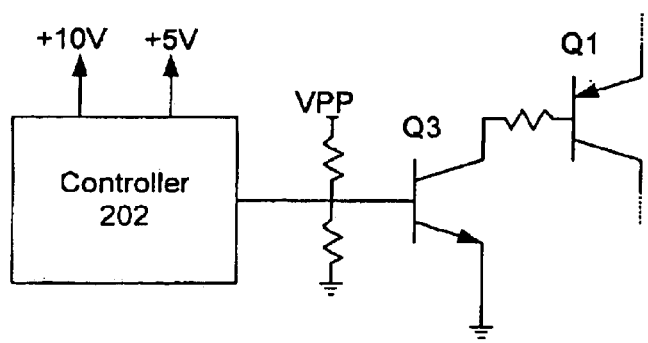
FIG. 2 is a simplified schematic of an alternative embodiment for the switching circuit topology of FIG. 1.

Moreover, the circuitry in the exemplary embodiment of FIG. 1 is only one way in which the invention may be implemented. That is, the manner in which the DC coupling is provided need not be limited to capacitive coupling in that other techniques, e.g., transformers T1 and T2, may be employed. In addition, instead of controlling the bases of Q1 and Q2 with the RC circuit shown in FIG. 1, other types of control circuits may be employed which include, but are not limited to, active circuit elements which are enabled for a programmable period of time. For example, according to an alternative embodiment illustrated in FIG. 2, the base of Q1 is coupled to the collector of another transistor Q3 which is driven to pull the base of Q1 down for a period of time. The driving signal of such a transistor and the period of time could be controlled by any of a variety of analog or digital circuitry (represented by controller 202) including, for example, a microprocessor or any other type of controller. This circuitry may be incorporated or integrated with the driver circuitry or separate therefrom. Such a controller may be configured to operate during stabilization of the supply voltages (e.g., during power up). Such a controller may also be configured to control Q1 and Q2 during amplifier operation independent of drive from the driver circuitry, e.g., in response to a fault condition such as, for example, the loss of power to any of the driver stages. In addition, and as will be understood, such a controller may be configured to drive transistors Q1 and Q2 directly.

According to a more specific embodiment, during normal operation, e.g., where the +5V and +10V applied to controller 202 are within acceptable limits, the gate of Q3 is held low. In the event that the +10V is lost and the driver circuitry is no longer operable to maintain a high level to the high side gate, the circuit of FIG. 2 ensures the high side gate is off. As will be understood, the monitoring circuit of FIG. 2 may be incorporated or integrated into the driver chip itself.

Finally, although various advantages, aspects, and objects of the present invention have been discussed herein with reference to various embodiments, it will be understood that the scope of the invention should not be limited by reference to such advantages, aspects, and objects.

What is claimed is:

1. A switching circuit, comprising:
   an output switch having a drive terminal and a power supply terminal;
   driver circuitry for providing a drive signal to the output switch;
   isolation circuitry for providing DC isolation between the driver circuitry and the output switch; and
   transient control circuitry for controlling the drive terminal, thereby keeping the output switch off during stabilization of a supply voltage at the power supply terminal.

2. The switching circuit of claim 1 wherein the isolation circuitry comprises a capacitor.

3. The switching circuit of claim 1 wherein the isolation circuitry comprises a transformer.

4. The switching circuit of claim 1 wherein the transient control circuitry comprises clamping circuitry operable to clamp the drive terminal to the supply voltage for a predetermined period of time.

5. The switching circuit of claim 4 wherein the clamping circuitry comprises a clamping switch coupled between the power supply terminal and the drive terminal.

6. The switching circuit of claim 5 wherein the clamping circuitry further comprises an RC circuit coupled to the power supply terminal which is operable to supply a gating signal to the clamping switch which lags behind the supply voltage.

7. The switching circuit of claim 5 wherein the clamping circuitry further comprises a second clamping switch which is operable to provide a gating signal to the clamping switch.

8. The switching circuit of claim 7 wherein the clamping circuitry further comprises a controller circuit which is operable to drive the second clamping switch.

9. The switching circuit of claim 8 wherein the controller circuit is operable to drive the second clamping switch in response to a fault signal.

10. The switching circuit of claim 8 wherein the controller circuit is operable to drive the second claiming switch during stabilization of the supply voltage.

11. The switching circuit of claim 5 wherein the clamping circuitry further comprises a controller circuit which is operable to provide a gating signal to the clamping switch.

12. The switching circuit of claim 11 wherein the controller circuit is operable to generate the gating signal in response to a fault signal.

13. The switching circuit of claim 11 wherein the controller circuit is operable to generate the gating signal during stabilization of the supply voltage.

14. The switching circuit of claim 1 further comprising a low voltage signal processor which is operable to provide an input signal to the driver circuitry.

15. The switching circuit of claim 14 wherein the low voltage signal processor and the driver circuitry are integrated in a single integrated circuit.

16. The switching circuit of claim 14 wherein the low voltage signal processor comprises a noise-shaping signal processor.

17. The switching circuit of claim 1 wherein the wherein the switching circuit comprises an audio switching amplifier.

18. The switching circuit of claim 1 wherein the switching circuit comprises any of a sigma delta modulator, a modified sigma delta modulator, and a pulse width modulation amplifier.

19. The switching circuit of claim 1 wherein the wherein the switching circuit comprises a switch mode power supply.

20. The switching circuit of claim 1 wherein the output switch comprises two switching devices in a half-bridge configuration.

21. The switching circuit of claim 1 wherein the output switch is configured in a single-ended configuration.

22. A switching amplifier, comprising:

first and second output FETs in a half-bridge, single-ended configuration coupled between high side and low side power supply terminals;

driver circuitry for providing complementary drive signals to the first and second output FETs;

first and second capacitors for coupling the driver circuitry to the first and second output FETs, respectively, and providing DC isolation therebetween;

a first clamping transistor coupled between the gate of the first output FET and the high side power supply terminal;

a first RC network coupled to the high side power supply terminal and operable to drive the first clamping transistor;

a second clamping transistor coupled between the gate of the second output FET and the low side power supply terminal;

a second RC network coupled to the low side power supply terminal and operable to drive the second clamping transistor;

wherein the clamping transistors and the RC networks are operable to clamp the gates of the output FETs to a high and low side supply voltages at the respective power supply terminals for a predetermined period of time, thereby keeping the output FETs off during stabilization of the high and low side supply voltages.

* * * * *